United States Patent
Harvey et al.

(10) Patent No.: US 8,388,751 B2
(45) Date of Patent: Mar. 5, 2013

(54) CONTROLLING TRANSPORT OF GAS BORNE CONTAMINANTS ACROSS A RIBBON SURFACE

(75) Inventors: David Harvey, Westford, MA (US); Weidong Huang, Acton, MA (US); Scott Reitsma, Shrewsbury, MA (US); Minh Sy Le, Newton, MA (US)

(73) Assignee: Max Era, Inc., Reno, NV (US)

( * ) Notice: Subject to any disclaimer, the term of this patent is extended or adjusted under 35 U.S.C. 154(b) by 812 days.

(21) Appl. No.: 12/542,131

(22) Filed: Aug. 17, 2009

(65) Prior Publication Data
US 2009/0301386 A1      Dec. 10, 2009

Related U.S. Application Data

(63) Continuation-in-part of application No. 12/138,799, filed on Jun. 13, 2008, and a continuation-in-part of application No. 12/138,791, filed on Jun. 13, 2008.

(60) Provisional application No. 61/089,603, filed on Aug. 18, 2008, provisional application No. 60/944,017, filed on Jun. 14, 2007.

(51) Int. Cl.
*C30B 15/20* (2006.01)
(52) U.S. Cl. ............. 117/23; 117/26; 117/209; 117/211
(58) Field of Classification Search .................. 117/23, 117/26, 209, 211
See application file for complete search history.

(56) References Cited

U.S. PATENT DOCUMENTS

| 3,265,469 | A | * | 8/1966 | Hall ........................... 117/203 |
| 4,158,038 | A | * | 6/1979 | Jewett ......................... 117/204 |
| 4,390,505 | A |   | 6/1983 | Taylor et al. |
| 2004/0083946 | A1 |   | 5/2004 | Wallace, Jr. |
| 2010/0288186 | A1 | * | 11/2010 | Bang ............................ 117/26 |

FOREIGN PATENT DOCUMENTS

| GB | 2135595 A | 9/1984 |
| JP | 53-093183 A | 8/1978 |
| JP | 2001-122696 A | 5/2001 |
| WO | 2008070458 A1 | 6/2008 |

OTHER PUBLICATIONS

International Search Report (dated Oct. 6, 2009), Appl. No. PCT/US2009/053991, 3 pages.
Final Rejection for related U.S. Appl. No. 12/138,799 dated Jul. 12, 2012, pp. 1-9.
European Office Communication for European Application No. 09 791 565.6-1215, dated Dec. 18, 2012, pp. 1-44.
Notice of Reasons for Rejection for Japanese Patent Application No. 2010-512374, dated Nov. 2, 2012, pp. 1-10.

* cited by examiner

*Primary Examiner* — Bob M Kunemund
(74) *Attorney, Agent, or Firm* — Ditthavong Mori & Steiner, P.C.

(57) ABSTRACT

A method of growing a ribbon crystal provides a crucible containing molten material and passes string through the molten material to grow the ribbon crystal. The method further directs gas flow around the ribbon crystal such that the gas flows down along the ribbon crystal toward the crucible.

32 Claims, 15 Drawing Sheets

CONTROLLING TRANSPORT OF GAS BORNE CONTAMINANTS ACROSS A RIBBON SURFACE

CROSS REFERENCE TO RELATED APPLICATIONS

The present application claims priority to U.S. Provisional Patent Application No. 61/089,603 filed Aug. 18, 2008, and is a continuation-in-part application of U.S. patent application Ser. No. 12/138,799 filed Jun. 13, 2008 and U.S. patent application Ser. No. 12/138,791 filed Jun. 13, 2008, both applications of which claim priority to U.S. Provisional Patent Application No. 60/944,017 filed Jun. 14, 2007, the disclosures of which are incorporated by reference herein in their entirety.

FIELD OF THE INVENTION

The invention generally relates to ribbon crystals and, more particularly, the invention relates to controlling contaminants during the growth of the ribbon crystals.

BACKGROUND OF THE INVENTION

Solar cells may be formed from silicon wafers fabricated by a "ribbon pulling" technique. The ribbon pulling technique generally uses a crystal growth system that includes a specialized furnace surrounding a crucible containing molten silicon. The furnace generally includes a base insulation that surrounds the crucible, and insulation (known as an "afterheater") positioned above the base insulation and near the growing ribbon crystal.

During the growth process, two strings are typically passed through the crucible so that molten silicon solidifies to its surface, thus forming a growing ribbon crystal between the two strings. Two or more ribbon crystals may be formed at the same time by passing multiple sets of strings through the crucible. The strings with the ribbon crystal attached are passed through the afterheater so that the ribbon crystal may cool in a controlled environment. The ribbon crystal is then removed from the furnace.

Care is usually taken throughout the process to reduce the amount of unwanted impurities or contaminants that are present in the ribbon crystal. Contaminants may detrimentally affect the properties of the ribbon crystal, which may impact the performance of devices made with such ribbon crystals. For example, contaminants can undesirably reduce the conversion efficiency of a solar cell made from such a ribbon crystal.

SUMMARY OF THE INVENTION

In accordance with one embodiment of the invention, a method of growing a ribbon crystal provides a crucible containing molten material and passes string through the molten material to grow the ribbon crystal. The method also directs gas flow around the ribbon crystal such that the gas flows down along the ribbon crystal toward the crucible.

In accordance with related embodiments, the method further provides an afterheater positioned above the crucible and adjacent to the ribbon crystal on at least one side. The afterheater has a shield coupled to at least a portion of the afterheater. The shield is positioned between the ribbon crystal and the afterheater. The shield may be formed of graphite, silicon carbide and/or quartz. The shield may include a plurality of sheets coupled to the afterheater with at least one rib. The rib may be aligned near an edge of the ribbon crystal. The method may further provide a base insulation that surrounds the crucible on at least two sides. The base insulation has a shield coupled to at least a portion of the base insulation, and the shield is positioned between the base insulation and the crucible. The crucible may include at least one baffle that abuts a portion of the shield. The base insulation may have at least one opening beneath the crucible, wherein the gas flows down past the crucible and through the at least one opening. The method may further direct gas into the at least one opening from an external gas source. The base insulation may have a shield coupled to at least a portion of the base insulation, wherein the shield is positioned between the base insulation and the crucible. The method may further provide at least one baffle coupled to the base insulation, wherein the gas flow is directed down past the at least one baffle and the crucible. The method may further provide an afterheater positioned above the crucible and adjacent to the ribbon crystal on at least two sides. The afterheater has at least one opening. The method may further direct gas into the at least one opening from an external gas source, wherein the gas is directed toward the ribbon crystal. The afterheater may have a shield coupled to at least a portion of the afterheater. The shield is positioned between the ribbon crystal and the afterheater. The method may further provide a gas seal coupled to the afterheater and adjacent to the ribbon crystal, wherein the gas flow is substantially away from the gas seal and toward the crucible. The method may further provide a housing surrounding the crucible and a portion of the ribbon crystal, and provide a shield coupled to at least a portion of the housing. The shield is adjacent to a portion of the ribbon crystal. The method may further provide a gas seal coupled to the housing and adjacent to the ribbon crystal. The gas seal has at least one opening. The method may further direct gas into the at least one opening from an external gas source. The gas is directed toward the ribbon crystal and gas flow is substantially away from the gas seal and along the shield between the ribbon crystal and the shield.

In accordance with another embodiment of the invention, a ribbon crystal growth system includes a crucible for containing molten material and a base insulation that surrounds the crucible on at least two sides. The base insulation may have one or more openings beneath the crucible. The ribbon crystal growth system may also include a gas system that provides gas from an external gas source through the at least one opening so that gas flows down past the crucible and through the at least one opening.

In accordance with another embodiment of the invention, a ribbon crystal growth system includes a crucible for containing molten material and an afterheater positioned above the crucible, the afterheater having an inner surface. The ribbon crystal growth system may also include at least one shield adjacent to the inner surface. The afterheater and the at least one shield are configured to allow a ribbon crystal to pass adjacent to the at least one shield. The at least one shield may be formed of graphite, silicon carbide and/or quartz.

In accordance with related embodiments, the shield may be coupled to the inner surface of the afterheater with at least one rib. Alternatively, the shield may be coupled to a housing surrounding the crucible and configured to allow a ribbon crystal to pass through a channel in the housing. The crucible may have at least two string holes that define a vertically extending plane along a ribbon crystal growth direction and the rib may be aligned with an edge of the plane. The system may also include a base insulation that surrounds the crucible on at least two sides and at least one base insulation shield coupled to at least a portion of the base insulation. The base insulation shield is positioned between the base insulation and the crucible. The crucible may include at least one baffle that abuts a portion of the base insulation shield.

BRIEF DESCRIPTION OF THE DRAWINGS

The foregoing and advantages of the invention will be appreciated more fully from the following further description thereof with reference to the accompanying drawings wherein.

DESCRIPTION OF ILLUSTRATIVE EMBODIMENTS

Various embodiments of the present invention provide a system and method of growing a ribbon crystal so that the amount of gas borne contaminants in the ribbon surface is reduced. This is accomplished by carefully controlling the environment and gas flow around the ribbon crystal during the growth and cooling process. It was surprisingly found that the contaminant level within the ribbon crystal was orders of magnitude greater than theoretically expected based on the composition of the material in the melt. The contaminant level was found to be greater at the surface than in the interior of the ribbon. It is believed that contaminants may be more readily incorporated into the surface of the ribbon crystal during the growth and cooling process. Therefore, it is important to provide an environment that reduces contaminants that the ribbon crystal is exposed to during the growth and cooling process. It is also important to direct the gas flow around the ribbon crystal in such a manner as to minimize any contaminants that may be incorporated into the ribbon crystal during this time. Details of illustrative embodiments are discussed below.

Figure 1:
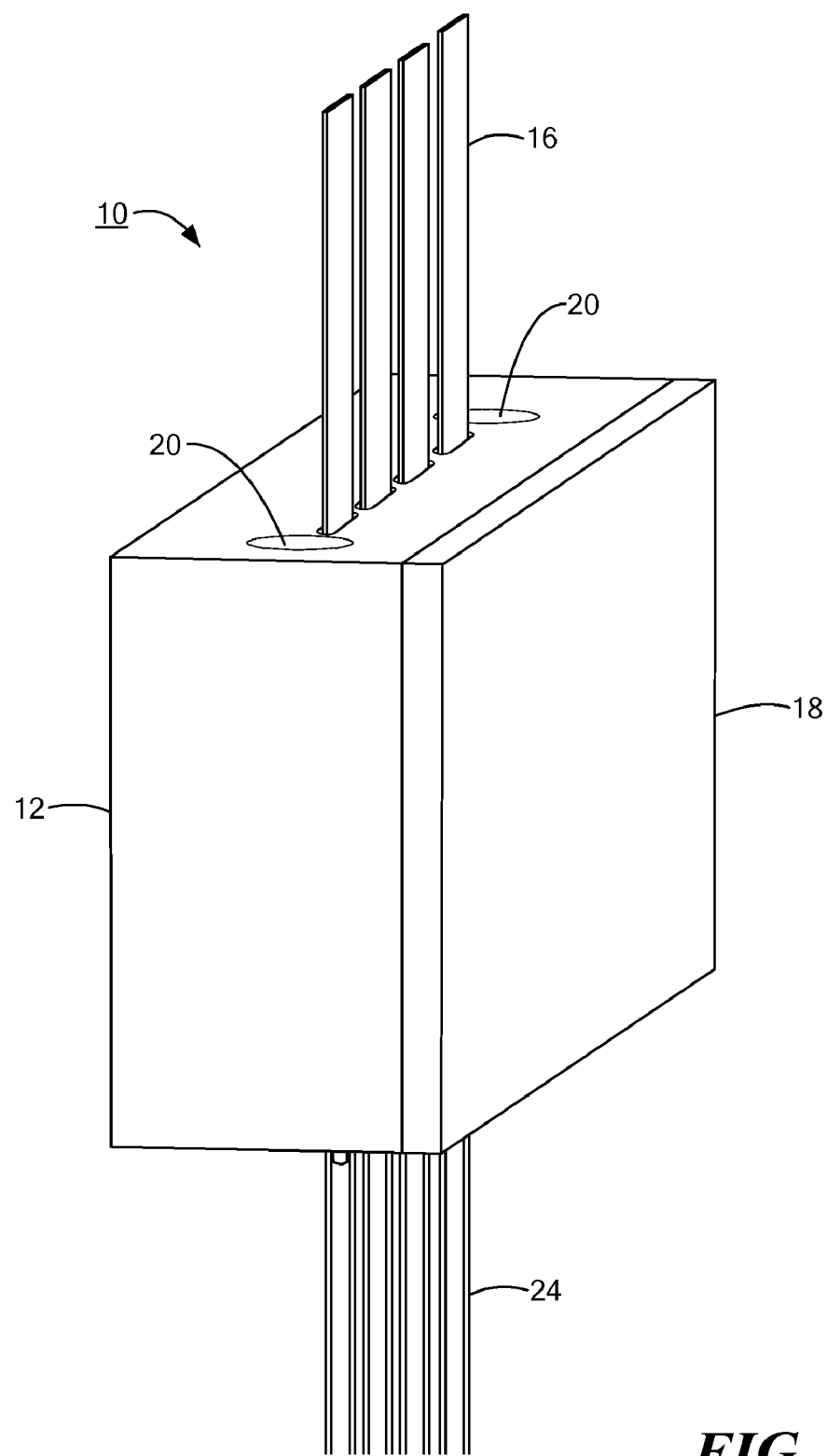
FIG. 1 schematically shows a perspective view of a ribbon crystal growth system according to embodiments of the present invention.

FIG. 1 schematically shows a ribbon crystal growth system 10 according to embodiments of the present invention. The growth system 10 includes a housing 12 forming an enclosed or sealed interior. The interior may be substantially free of oxygen (e.g., to prevent combustion) and may include one or more gases, such as argon or other inert gas, that may be provided from an external gas source. The interior includes a crucible 14 (as shown in FIGS. 2-9) and other components for substantially simultaneously growing a plurality of silicon ribbon crystals 16. Although FIG. 1 shows four ribbon crystals, the growth system 10 may substantially simultaneously grow fewer or more of the ribbon crystals. The ribbon crystals 16 may be formed from single crystal silicon or multi-crystalline silicon. The housing 12 may include a door 18 to allow inspection of the interior and its components and one or more optional windows 20. The housing 12 may also provides a means for directing feedstock material (not shown) into the interior of the housing 12 to the crucible 14 to be melted. It should be noted that discussion of the silicon ribbon crystals 16 is illustrative and not intended to limit all embodiments of the invention. For example, the ribbon crystals 16 may be formed from other materials, e.g., other metals or alloys.

Figure 2:
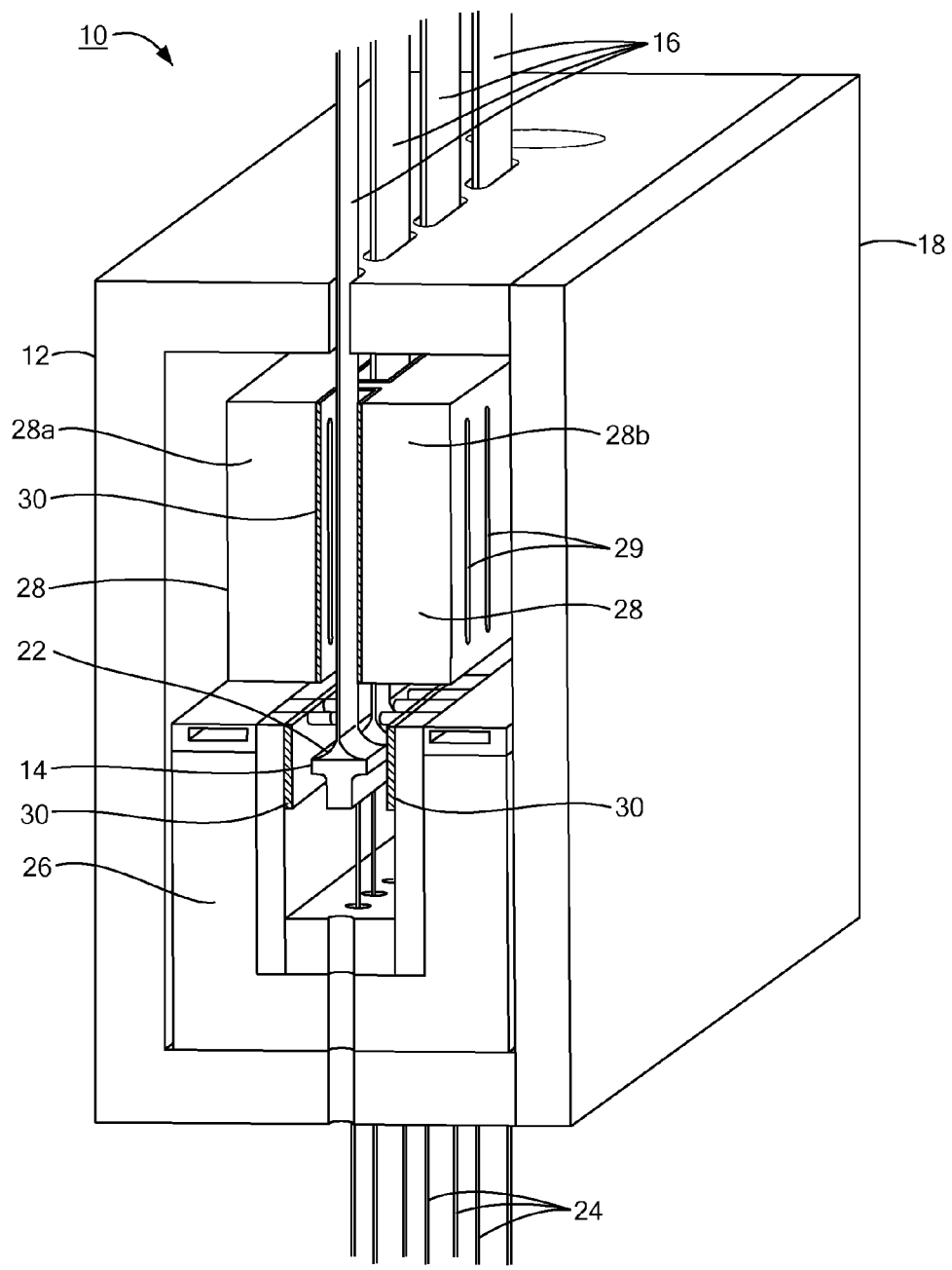
FIG. 2 schematically shows a partially cut away view of a ribbon crystal growth system, according to embodiments of the present invention, with part of the housing removed.

FIG. 2 schematically shows a partially cut away view of a growth system 10 with part of the housing 12 removed. As shown, the growth system 10 includes a crucible 14 for containing molten material 22 in the interior of the housing 12. In one embodiment, the crucible 14 may have a substantially flat top surface that may support or contain the molten material 22. The crucible 14 may include string holes (not shown) that allow strings 24 to pass through the crucible 14. As the strings 24 pass through the crucible 14, molten silicon solidifies to its surface, thus forming the growing ribbon crystal 16 between two strings 24. The crucible 14 may have an elongated shape with a region for growing ribbon crystals 16 in a side-by-side arrangement along its length.

The growth system 10 also includes insulation that is configured based upon the thermal requirements of the regions in the housing 12, e.g., the region containing the molten material 22 and the region containing the resulting growing ribbon crystal 16. As such, the insulation includes a base insulation 26 that forms an area containing the crucible 14 and the molten material 22, and an afterheater 28 positioned above the base insulation 26 (from the perspective of the drawings). The afterheater 28 may be supported by the base insulation 26, e.g., by posts (not shown). In addition, or alternatively, the afterheater 28 may be attached or secured to a top portion of the housing 12. In some embodiments, the afterheater 28 has two portions (28a, 28b) which are positioned on either side of the growing ribbon crystals 16. The two portions 28a, 28b form one or more channels through which the ribbon crystal 16 grows. Alternatively, the afterheater 28 may also be positioned on only one side of the growing ribbon crystals 16. The afterheater 28 provides a controlled thermal environment that allows the growing ribbon crystal 16 to cool as it rises from the crucible 14. In some embodiments, the afterheater 28 may have one or more additional openings or slots 29 within the afterheater 28 for controllably venting heat from the growing ribbon crystals 16 as it passes through the inner surface of the afterheater 28.

The growth system 10 may also include one or more ribbon shields 30 that protect the growing ribbon crystals 16 from contaminants that may be introduced from the base insulation 26 and/or the afterheater 28. During the growth and cooling process, contaminants may outgas from the base insulation 26 and/or the afterheater 28 and diffuse into the growing ribbon crystals 16. The ribbon shield 30 provides a protective barrier between the growing ribbon crystal 16 and the insulation 26, 28 in order to reduce the amount of contaminants that the ribbon crystal is exposed to in the growth and cooling environment, thus reducing the impurity concentration in ribbon crystal 16.

The ribbon shield 30 may be coupled to at least a portion of the afterheater 28 positioned between the afterheater 28 and the ribbon crystals 16. Preferably, the ribbon shield 30 is coupled to the afterheater 28 on either side of the ribbon crystals 16. The ribbon shield 30 may be coupled to the inner surface of the afterheater 28, as shown, or the ribbon shield 30 may be attached to the top of the afterheater 28 or the top of the housing 12 (not shown). Alternatively, or in addition, the ribbon shield 30 may be coupled to at least a portion of the base insulation 26 positioned between the base insulation 26 and the crucible 14. Preferably, the ribbon shield 30 is coupled to the base insulation 26 on either side of the crucible 14 and ends somewhere below the top of the crucible 14 where the molten material 22 is contained.

In order to protect the ribbon crystals 16 from contaminants from the base insulation 26 and/or the afterheater 28, the ribbon shield 30 preferably is formed from a very pure, high quality material that is able to withstand relatively high temperatures. For example, the ribbon shield material preferably operates in temperatures ranging from about 1000° C. to about 1500° C. The base insulation 26 and/or the afterheater 28 are typically formed from a low density, carbon insulation material such as carbon foam, carbon fiber or graphite foam materials. Thus, the ribbon shield 30 may be formed from a variety of materials that have a higher purity than the typical insulation materials. Preferably, the ribbon shield 30 is formed from a hard, dense material. For example, the ribbon shield 30 may be formed of silicon carbide, quartz, graphite, or a combination thereof. The ribbon shield 30 may be a layer, such as a cladding layer, formed on or coupled to the base insulation 26 and/or the afterheater 28. The ribbon shield 30 may be a coating formed on the base insulation 26 and/or the afterheater 28 or formed on a ribbon shield material, e.g., CVD silicon carbide coating graphite. The ribbon shield 30 may be a plurality of sheets or plates attached to the base insulation 26 and/or the afterheater 28. The ribbon shield 30 may be removably coupled to the base insulation 26 and/or the afterheater 28 so that the ribbon shield 30 may be easily replaced over time if it becomes contaminated, e.g., molten silicon splashing on it or damaged in some way.

The growth system 10 may also include one or more gas systems (not shown in FIG. 2) as described in more detail below with regard to FIGS. 4-10B, to reduce the amount of contaminants that the ribbon crystal is exposed to in the growth and cooling environment.

Figure 3:
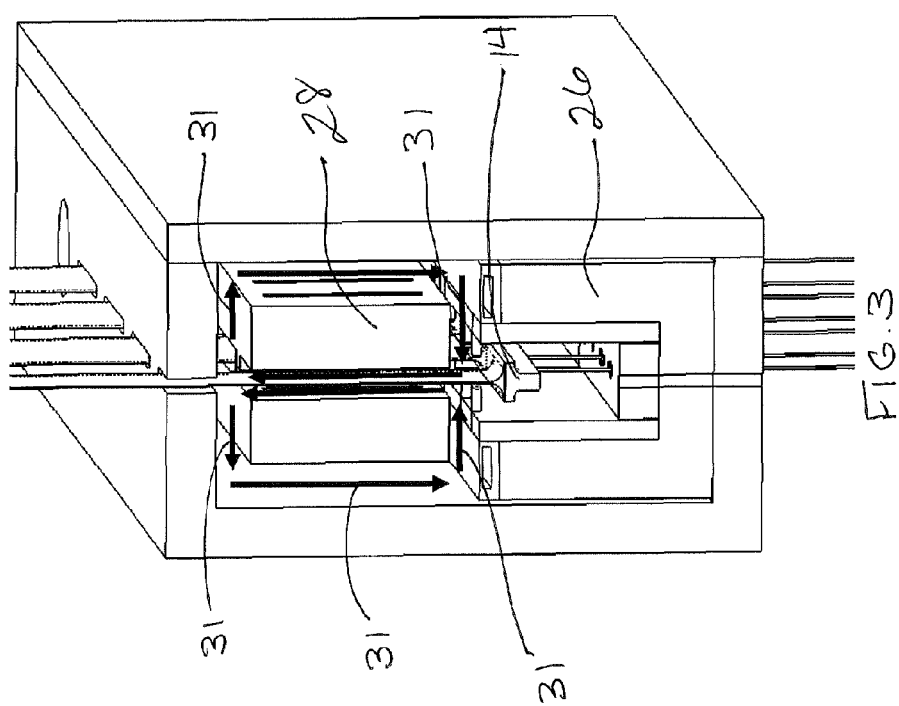
FIG. 3 schematically shows a partially cut away view of a prior art ribbon crystal growth system and the gas flow in its system.

For example, as shown in FIG. 3, in a typical ribbon crystal growth system, gases within the housing 12 tend to flow in toward the crucible 14 between the base insulation 26 and the afterheater 28 (gas flow shown by arrows 31). The gases then flow up away from the crucible 14 and along the growing ribbon crystal 16. The gases naturally flow in this direction due, in part, to the ribbon crystal 16 emitting heat as it rises from the crucible and cools. As the air around the growing ribbon crystal warms (and the air is warmed more around the ribbon crystal near the crucible 14 than near the top of the afterheater 28), the warm air rises along the ribbon crystal 16 between the ribbon crystal 16 and the afterheater 28. This effect tends to create a gas flow or draft up along the ribbon crystal, which causes cooler air to come in from the sides to replace the warm air flowing up.

It is believed that the gas flowing in toward the crucible carries contaminants to the ribbon surface during a time when the ribbon crystal 16 is more susceptible to incorporating these contaminants into the surface of the material, i.e., when the ribbon crystal 16 is initially formed from the melt and beginning to cool. Thus, various embodiments of the present invention control the gas flow in the system in such a way as to reduce these gas borne contaminants in the system and/or to minimize the impact of these contaminants during the growth process. For example, various embodiments may include blocking the gas flow through the gap between the base insulation and the afterheater, introducing another gas into the system, such as an inert gas, that reduces the concentration of contaminants at the ribbon crystal surface, and/or creating alternative flow patterns in the system by introducing another gas and/or a pumping mechanism into the housing.

It is also believed that contaminants may be carried to the ribbon surface during this time from the insulation materials surrounding the growing ribbon crystal 16. Thus, various embodiments of the present invention provide a protective barrier in the system, with or without controlling the gas flow, so as to reduce these gas borne contaminants coming from the base insulation 26 and/or the afterheater 28 to minimize the impact of these contaminants during the growth process.

Figure 4:
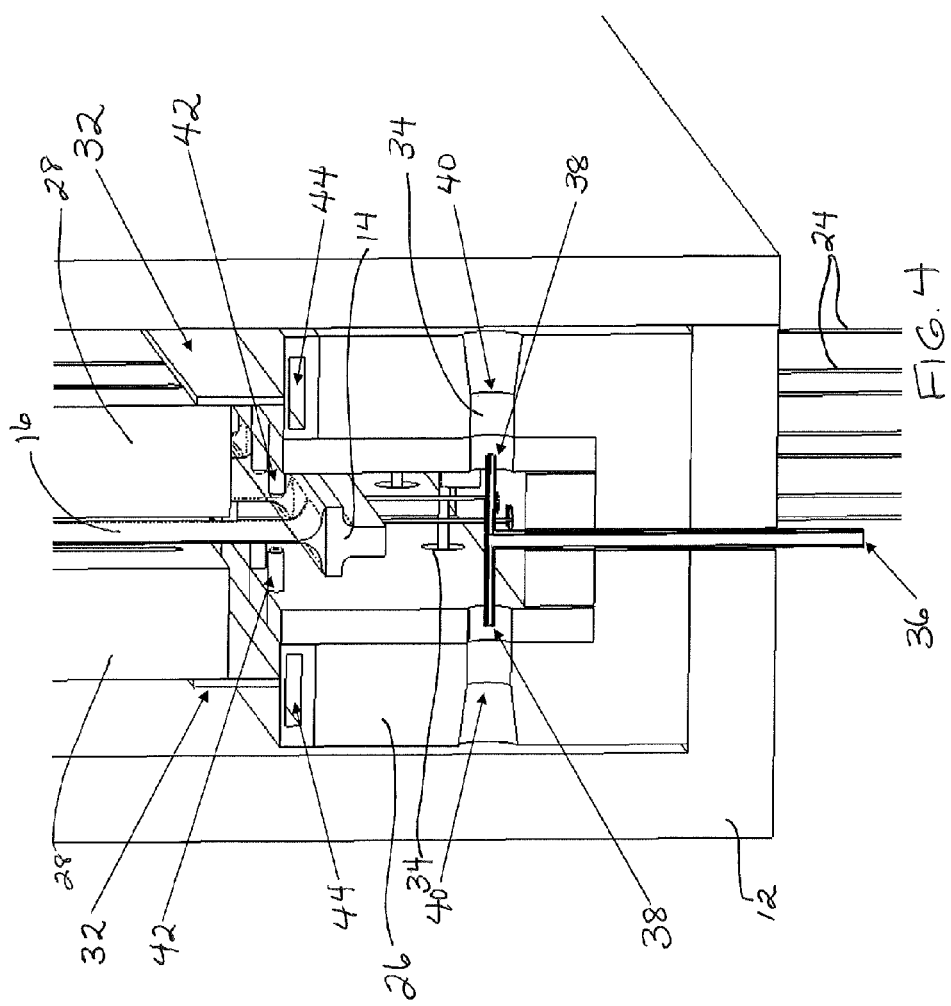
FIG. 4 schematically shows a partially cut away view of a ribbon crystal growth system having a gas system in the base insulation and baffles according to embodiments of the present invention.
Figure 5:
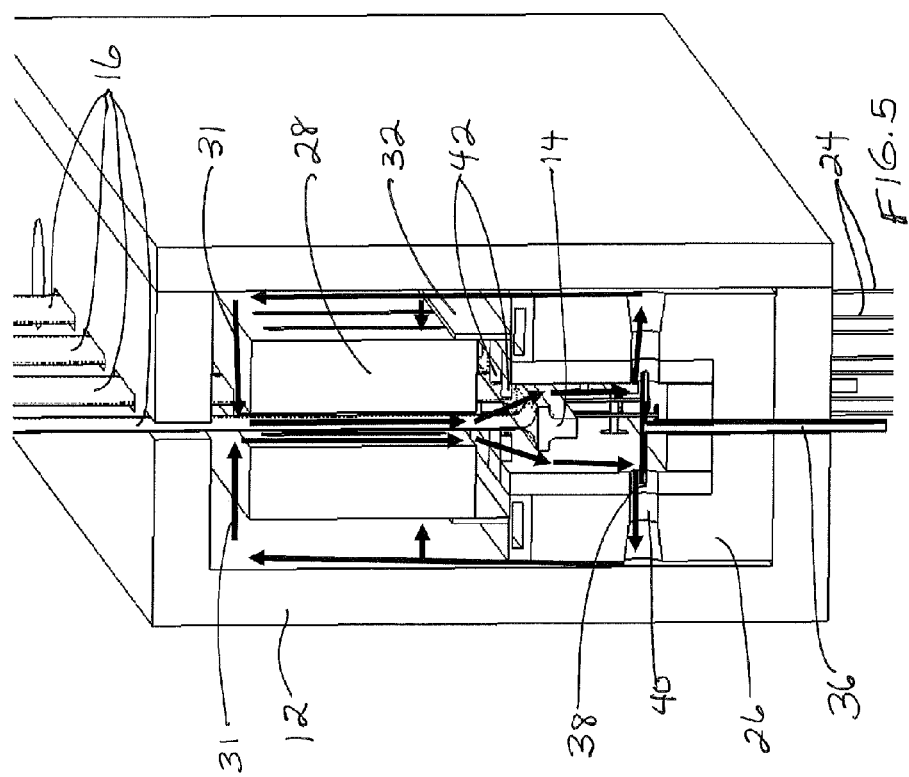
FIG. 5 schematically shows the gas flows in the ribbon crystal growth system shown in FIG. 4 according to embodiments of the present invention.

For example, FIGS. 4 and 5 schematically show one embodiment in which the gas flows 31 down along the ribbon crystal 16 toward the crucible 14, rather than away from it. This is accomplished by providing a gas system in the base insulation 26 along with baffles 32 between the base insulation 26 and the afterheater 28. As shown in FIGS. 4 and 5, the base insulation 26 may include one or more openings 34 formed beneath the crucible 14. The gas system may supply gas from an external gas source (not shown) via a gas supply line 36 to the openings 34. The gas supply line 36 may include one or more gas jets 38 for directing the gas into the openings 34. The openings 34 may be configured to have a nozzle shape 40 (e.g., smaller diameter to larger diameter shape) so that the gas system effectively creates a gas pumping mechanism within the housing 12. This pumping action alters the gas flow within the housing 12 causing the gas to flow down along the ribbon crystal 16 toward the crucible 14.

For example, when gas is supplied into the openings 34, the gas flows (shown by arrows 31 in FIG. 5) through the nozzle 40 from the inner surface of the base insulation 26 facing the crucible 14 to the outer surface facing the housing 12. The gas then flows up along the sides of the housing 12 toward its top and across the top of the afterheater 28 toward the ribbon crystal 16. As the gas moves within the nozzle 40, this tends to create a drop in pressure at the inner surface of the openings 34, causing the gas around the crucible 14 to flow downward and into the openings 34. This action, along with the gas flow going up along the sides of the housing 12, creates a downward gas flow along the ribbon crystal 16 near the afterheater 28 toward the crucible 14.

In some embodiments, the growth system 10 may also include a gas cooling system that may supply gas from an external gas source (not shown) to gas cooling jets 42 through a gas cooling manifold 44. The gas cooling system may provide gas to further cool the growing ribbon crystal 16. For example, as shown in FIGS. 4 and 5, the gas cooling jets 42 may face toward the growing ribbon crystal 16 in the area above the crucible 14. Though the gas cooling system supplies gas to the growth system 10, the amount of gas provided is such that it does not significantly alter the overall gas flow patterns created by the gas system in the base insulation 26.

Baffles 32 may also be provided between the base insulation 26 and the afterheater 28 so that the gas flow is prevented from entering the gap between these two structures. The baffles 32 may be coupled to the top of the base insulation 26 and adjacent to the outer surface of the afterheater 28 away from the ribbon crystal 16. Alternatively, the baffles 32 may be coupled to the outer surface of the afterheater 28 and adjacent to the top of the base insulation 26.

Figure 6:
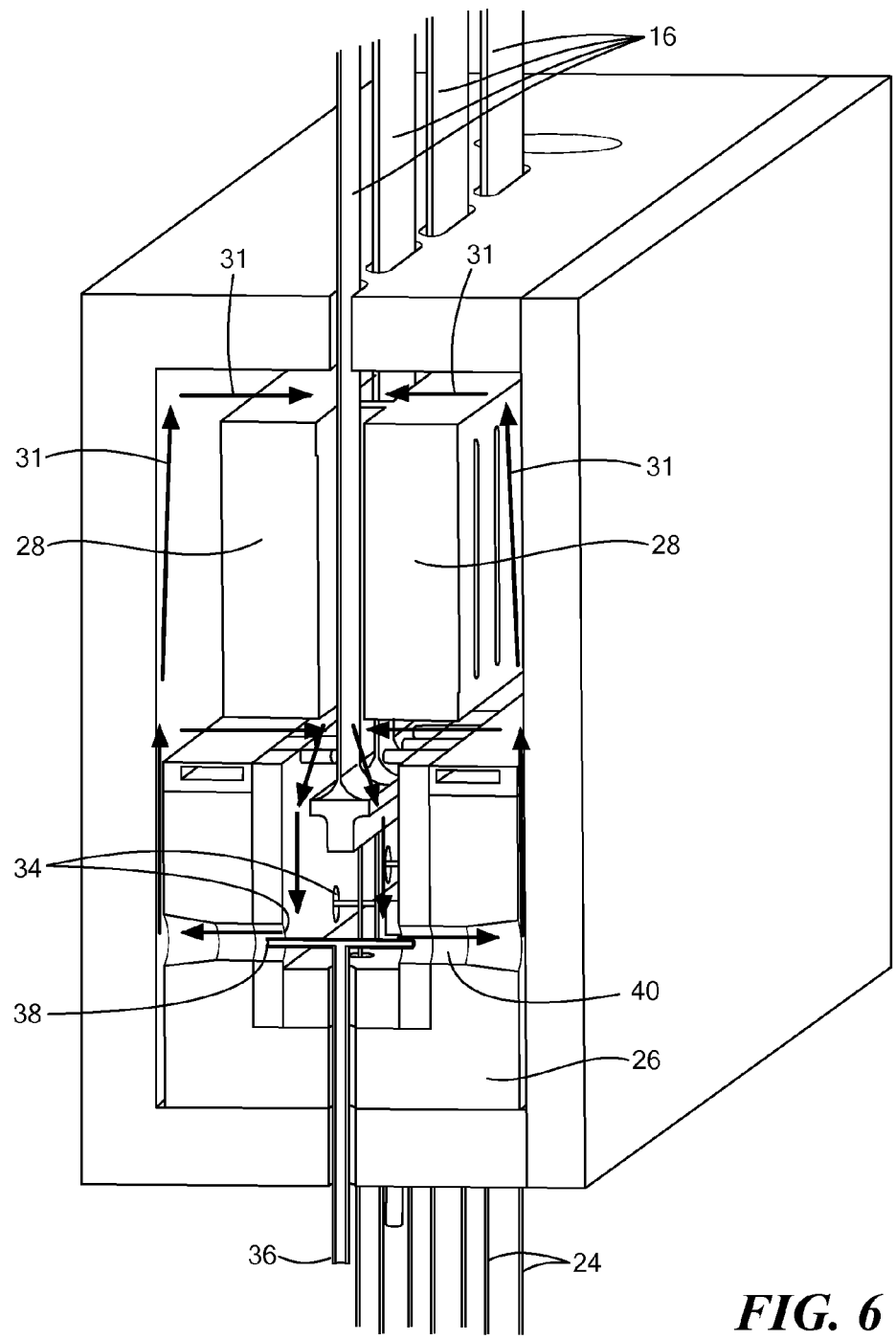
FIG. 6 schematically shows the gas flows in the ribbon crystal growth system shown in FIG. 4 without baffles according to embodiments of the present invention.

Another embodiment may include a gas system in the base insulation 26, as described above with respect to FIGS. 4 and 5, but without the baffles 32. As shown in FIG. 6, this configuration still creates a downward gas flow along the ribbon crystal 16 near the afterheater 28 toward the crucible 14. Although some gas flows in between the afterheater 28 and the base insulation 26, the overall downward flow pattern along the ribbon crystal 16 causes some of the laterally flowing gas from the sides to be turned downward toward the crucible 14 and away from the growing ribbon crystal 16. This minimizes the detrimental impact on the ribbon crystal 16 of any contaminants that may be contained in the laterally flowing gas.

Figure 7:
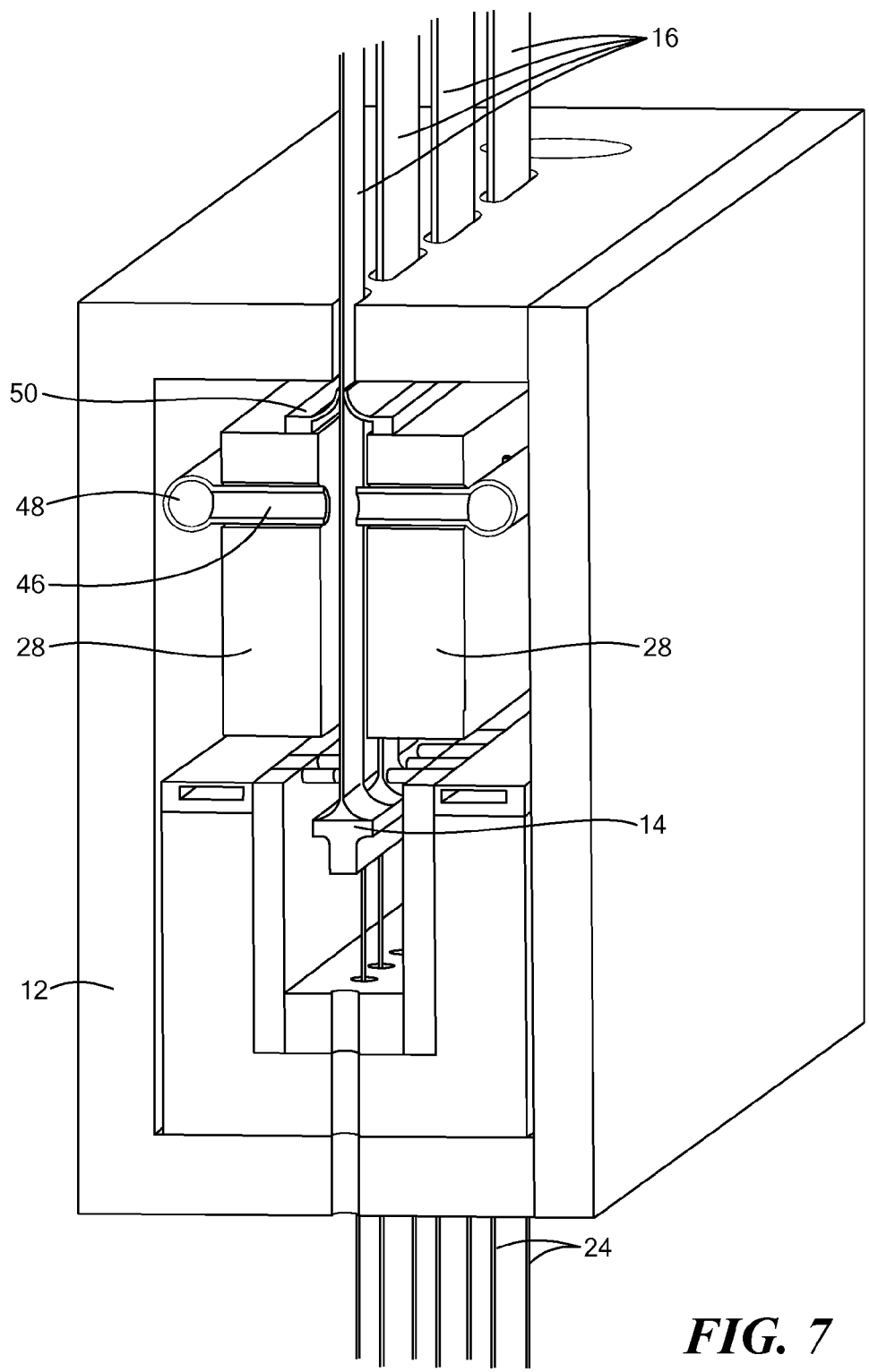
FIG. 7 schematically shows a partially cut away view of a ribbon crystal growth system having a gas system in the afterheater according to embodiments of the present invention.
Figure 8:
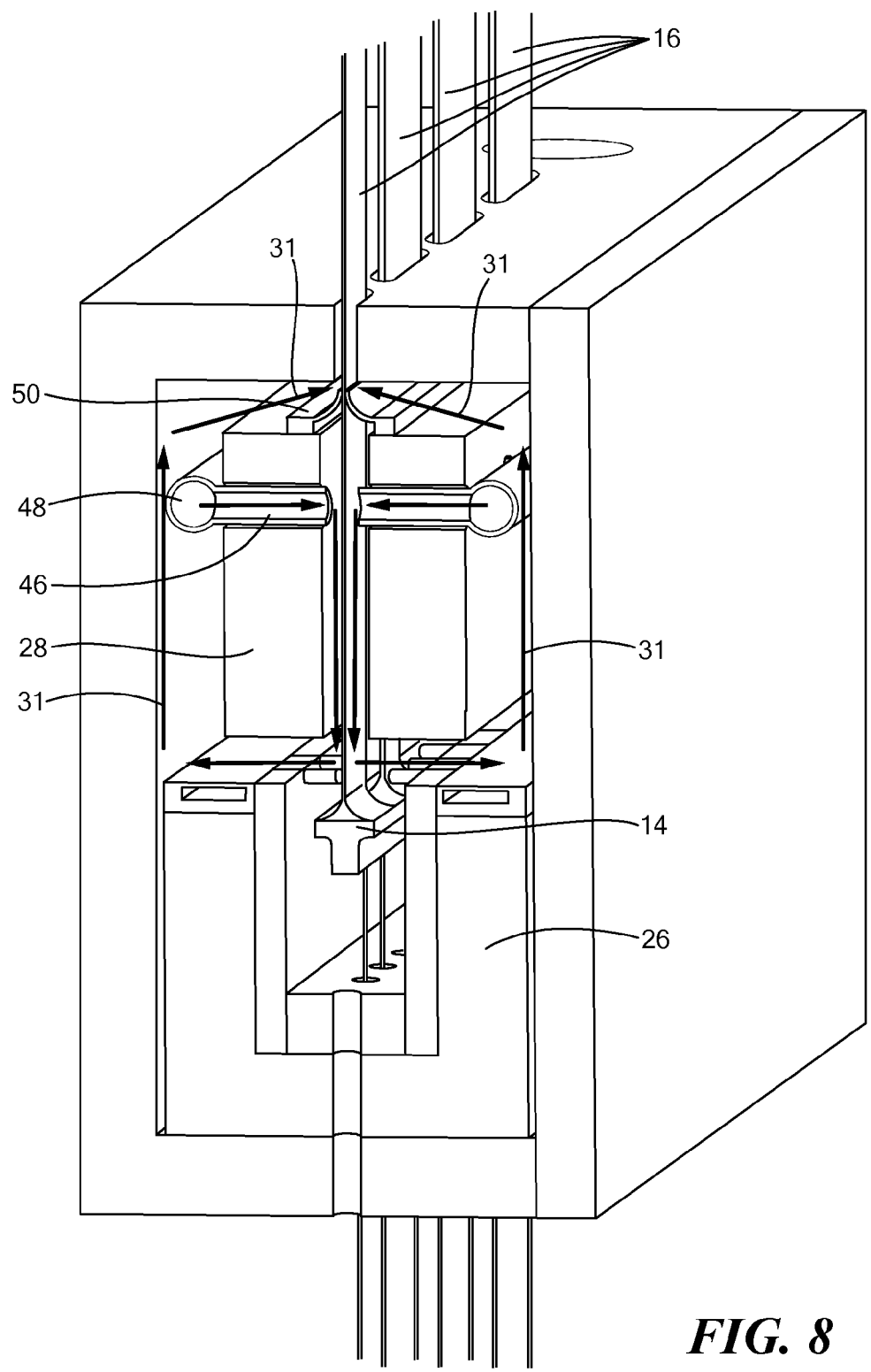
FIG. 8 schematically shows the gas flows in the ribbon crystal growth system shown in FIG. 7 according to embodiments of the present invention.

FIGS. 7 and 8 schematically show another embodiment in which a gas system is provided in the afterheater 28. As shown, the afterheater 28 includes one or more openings 46 formed in one or both portions of the afterheater 28. The gas system may supply gas from an external gas source (not shown) via a gas supply line 48 to the openings 46. In this case, the gas flows in through the openings 46 toward the ribbon crystal 16. The afterheater 28 may also include a gas seal 50 coupled to the top of the afterheater 28. The gas seal 50 essentially narrows the channel in which the ribbon crystal 16 passes in the top of the afterheater 28. This effectively creates a seal between the ribbon crystal 16 and the gas seal 50 so that the gases flowing in through the openings 46 are substantially directed in a downward direction (shown by arrows 31 in FIG. 8) along the ribbon crystal 16 toward the crucible 14. The gas seal 50 substantially prevents the gases from flowing up along the ribbon crystal 16 and substantially prevents the laterally flowing gases from entering in from the top of the afterheater 28.

Figure 9:
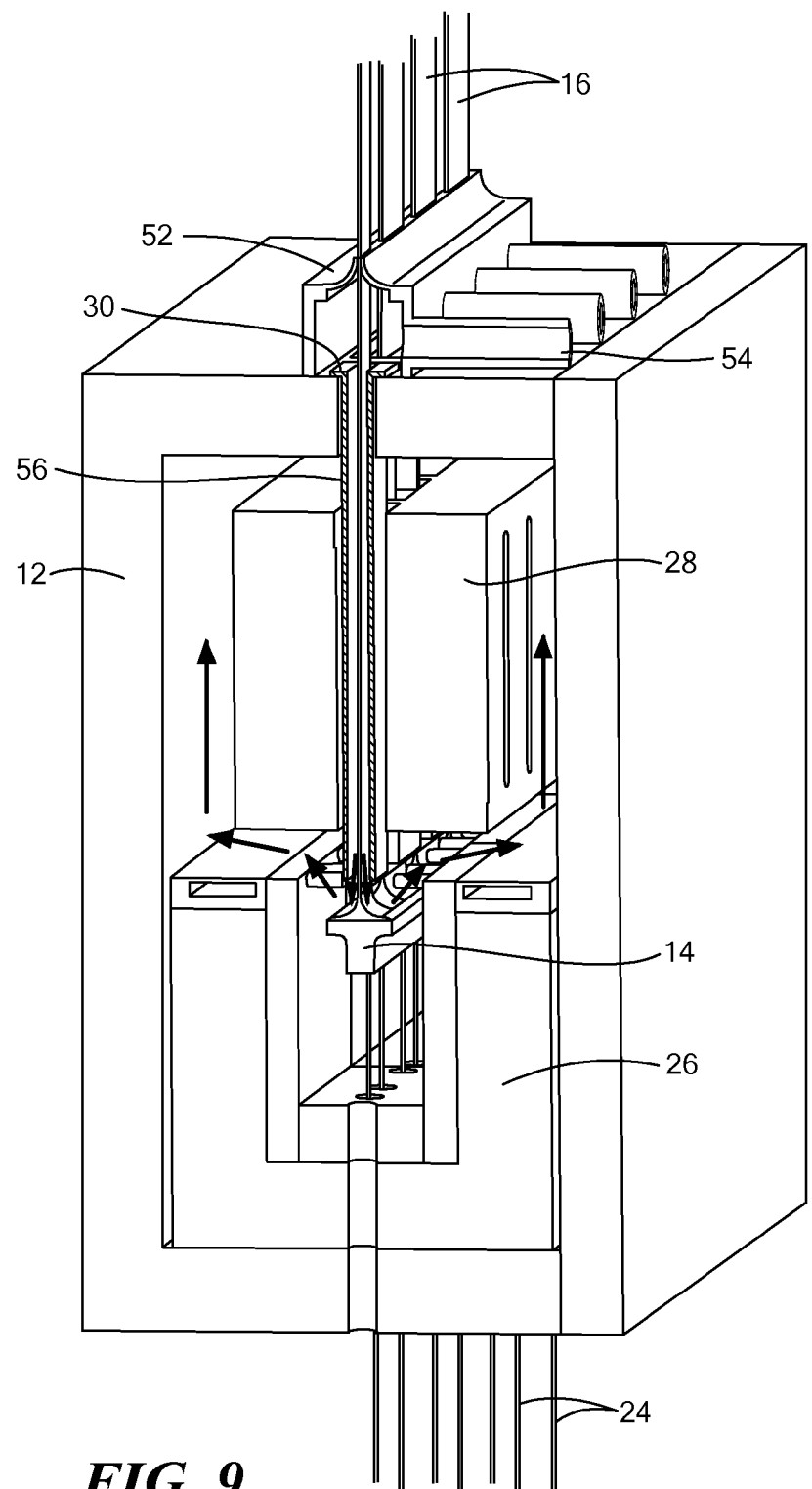
FIG. 9 schematically shows a partially cut away view of a ribbon crystal growth system having a gas system attached to the housing and a ribbon shield according to embodiments of the present invention.
Figure 10A:
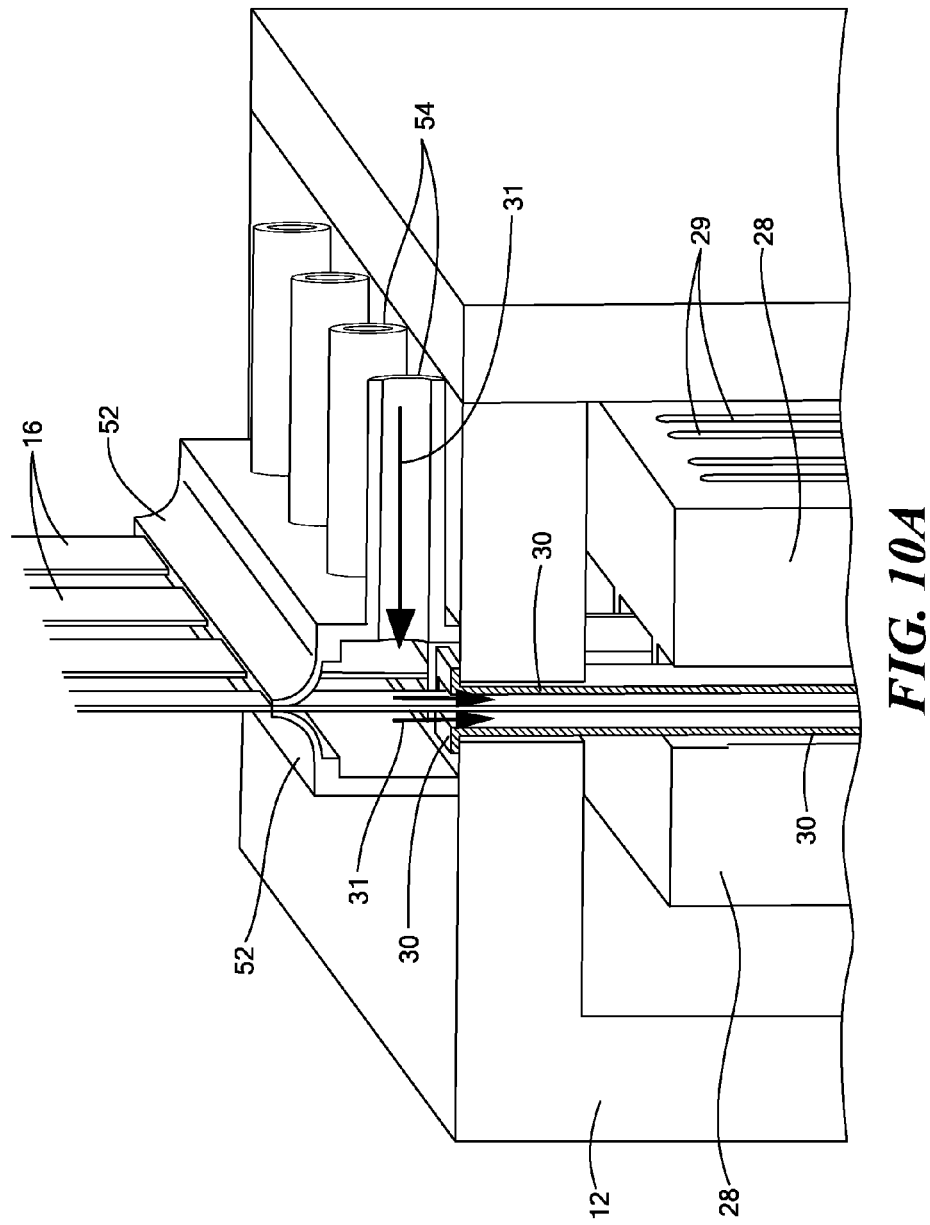
FIG. 10A schematically shows the gas flows in the upper part of the ribbon crystal growth system shown in FIG. 9 according to embodiments of the present invention.
Figure 10B:
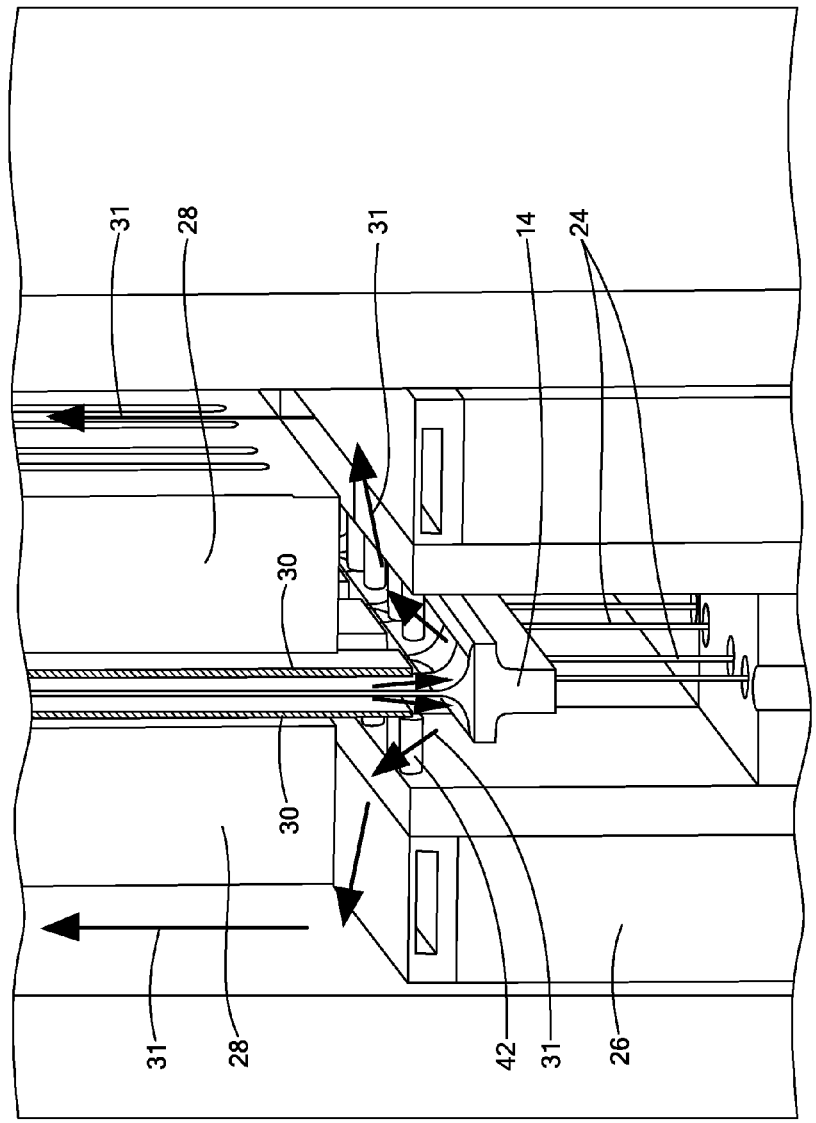
FIG. 10B schematically shows the gas flows in the lower part of the ribbon crystal growth system shown in FIG. 9 according to embodiments of the present invention.

FIGS. 9-10B schematically show another embodiment in which a gas system is provided on the outside of the housing 12. As shown, a gas seal 52 may be coupled to the top of the housing 12 around the channel where the ribbon crystal 16 passes out of the housing 12. The gas seal 52 includes one or more openings 54 formed in the gas seal 52. Although FIGS. 9 and 10A show the openings 54 in one side of the gas seal 52, the openings 54 may be on either or both sides of the gas seal 52. The gas system may supply gas from an external gas source (not shown) into the openings 54. The gas flows in through the openings 54 toward the ribbon crystal 16. The gas seal 52 essentially narrows the channel in which the ribbon crystal 16 passes in the top of the housing 12. This effectively creates a seal between the ribbon crystal 16 and the gas seal 52 so that the gases flowing in through the openings 52 are substantially directed in a downward direction (shown by arrows 31 in FIGS. 10A and 10B) along the ribbon crystal 16 toward the crucible 14. The gas seal 52 substantially prevents the gases from flowing up along the ribbon crystal 16 and substantially prevents the gases from entering into the housing 12 from its top.

In this embodiment, one or more of the ribbon shields 30 may be used to maintain the gas flows along the ribbon crystal 16 toward the crucible 14. One set of the ribbon shields 30 may be used for each ribbon crystal 16 grown in the growth system 10. The ribbon shield 30 is adjacent to the channel in the housing 12 that allows the ribbon crystal to pass through. The ribbon shield 30 may be coupled to the top of the housing 12 (as shown in FIG. 10A) or secured to the gas seal 52. The ribbon shield 30 may be provided along the length of the ribbon crystal 16 in the housing 12 so that gas is prevented from laterally flowing in to the ribbon crystal 16 along the top of the afterheater 28. As shown in FIG. 10B, the ribbon shield 30 may end somewhere above the crucible 14 so that the downwardly flowing gases exit the bottom of the ribbon shield 30 and laterally flow outward toward the sides of the housing 12 and the outside of the afterheater 28.

Figure 11:
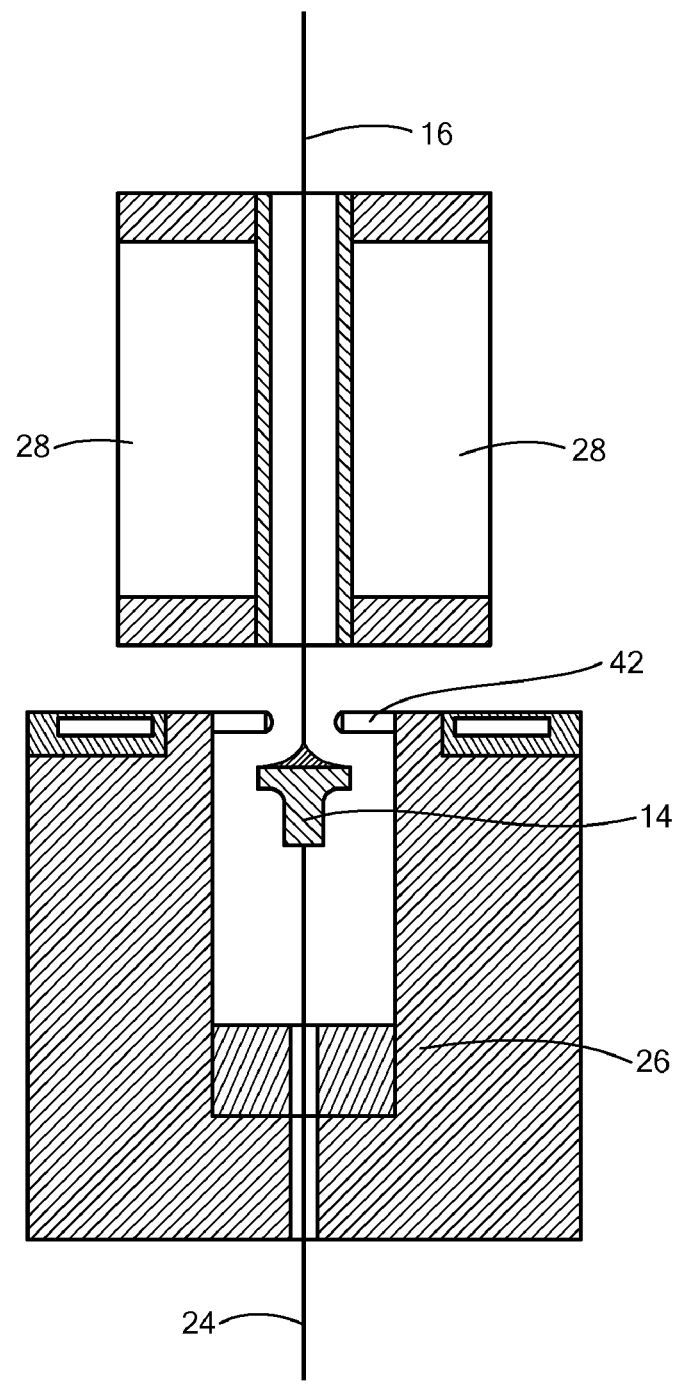
FIG. 11 schematically shows a cross-sectional view of a ribbon crystal growth system having a ribbon shield coupled to the afterheater according to embodiments of the present invention.
Figure 12:
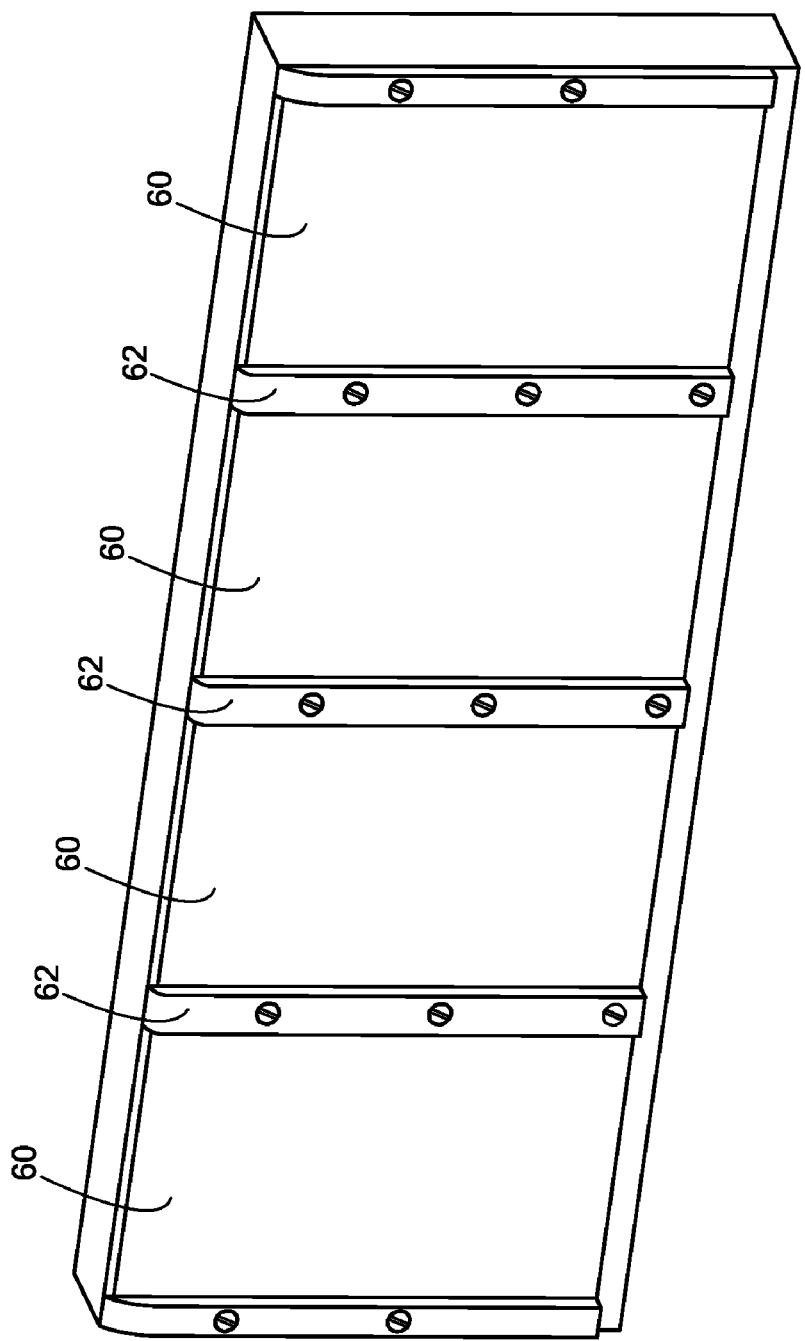
FIG. 12 schematically shows a perspective view of one portion of the afterheater with a plurality of ribbon shields according to embodiments of the present invention.

As mentioned above, the ribbon shield 30 may be coupled to the base insulation 26 and/or the afterheater 28. For example, FIG. 11 schematically shows a cross-sectional view of a ribbon crystal growth system 10 having ribbon shields 30 coupled to the inner surface of the afterheater 28. FIG. 12 shows a perspective view of one portion of the afterheater 28 shown in FIG. 11. The ribbon shield 30 may be one layer, coating or sheet or may be a plurality of sheets or plates 60 attached to the afterheater 28 with one or more ribs 62, as shown in FIG. 12. The sheets 60 and the ribs 62 may be positioned in the afterheater 28 in such a way as to control the temperature gradients near the growing ribbon crystal 16, potentially reducing the stresses within the growing ribbon crystal 16. The ribs 62 may be positioned at specified locations to control certain characteristics and qualities of the growing ribbon crystals 16.

For example, the crucible 14 may have a plurality of string holes (not shown) for receiving string 24. As the string 24 passes through the crucible 14, molten silicon solidifies to its surface, thus forming the growing ribbon crystal 16. Undesirably, there may be portions of the growing ribbon crystal 16 that, absent some further cooling, may be thinner than intended (e.g., forming thin, fragile "neck regions"). Therefore, the ribs 62 may be positioned near those sections of the growing ribbon crystal 16 to ensure appropriate cooling and thus, the desired thickness. Accordingly, the ribs 62 may be formed from a material that has different heat conductive properties (e.g., higher conductive properties) than the sheets 60. For example, the sheets 60 may be formed of silicon carbide and the ribs 62 may be formed of graphite.

As shown, the ribs 62 may be in the form of rectangular strips that each have a substantially uniform width. Alternatively, or in addition, one or more of the ribs 62 may have varying widths. In other embodiments, one or more of the ribs 62 may have different shapes either uniform or varying, e.g., oval shapes, irregular shapes. The ribs 62 may be positioned adjacent to one another with each rib 62 extending substantially the length of the afterheater 28 in the vertical direction, as shown in FIG. 12. Alternatively, the ribs 62 may include shorter sections that are vertically aligned on top of one another with little to no space between sections, or a designated amount of space between sections. The size and shape of the ribs 62 may be varied depending on the desired thickness of the ribbon crystals 16. However, in general, the size and shape should not be too large because the ribbon crystal 16 may become too thick at certain areas, and/or have undesirable internal strains or stresses. The size and shape of the ribs 62 thus should be carefully controlled to minimize such strains or stresses, and ensure appropriate ribbon crystal thickness.

For example, two string holes may be considered as forming a plane extending vertically upwardly through the system 10 along the ribbon crystal growth direction. The ribbon crystal 16 grows generally parallel to this plane. The ribs 62 may be positioned or aligned along the edge of this plane or the growing ribbon crystal 16, or may be positioned anywhere along this vertically extending plane, thus reducing the temperature in that region of the system 10. Reducing the temperature in that region should have the effect of increasing the ribbon crystal thickness in the corresponding area.

Figure 13:
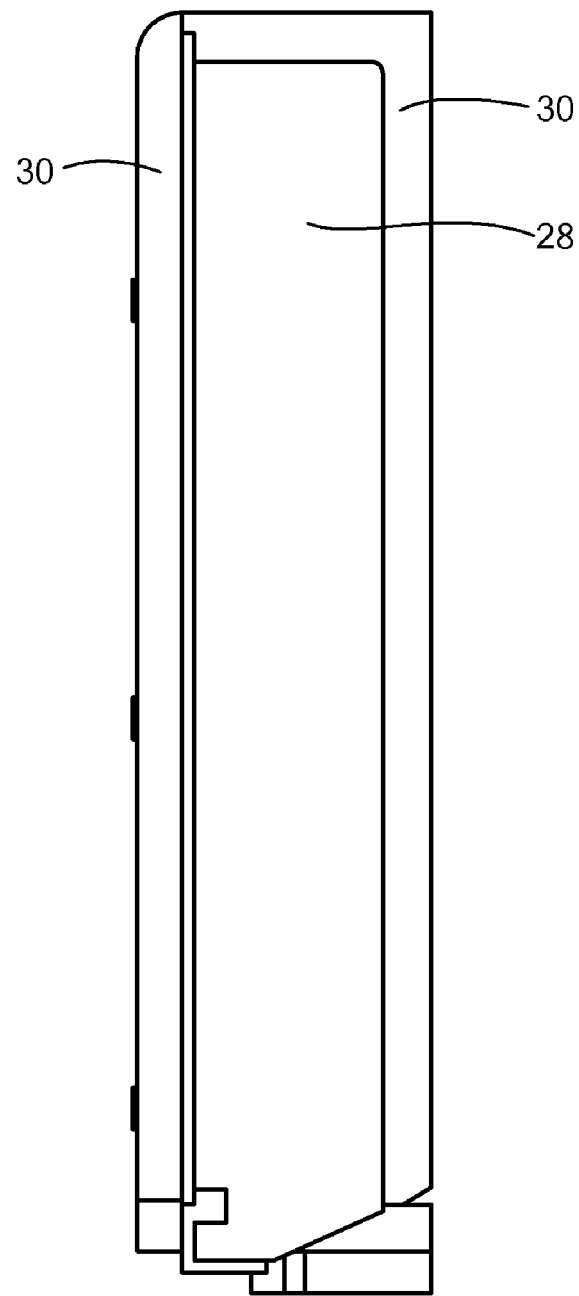
FIG. 13 schematically shows a cross-sectional view of one portion of the afterheater shown in FIG. 12 according to embodiments of the present invention.

Although FIG. 11 shows the ribbon shield 30 on the inner surface of the afterheater 28, the ribbon shield 30 may also be included on other surfaces of the afterheater 28. For example, as shown in FIG. 13, the ribbon shield 30 may substantially surround the afterheater 28.

Figure 14:
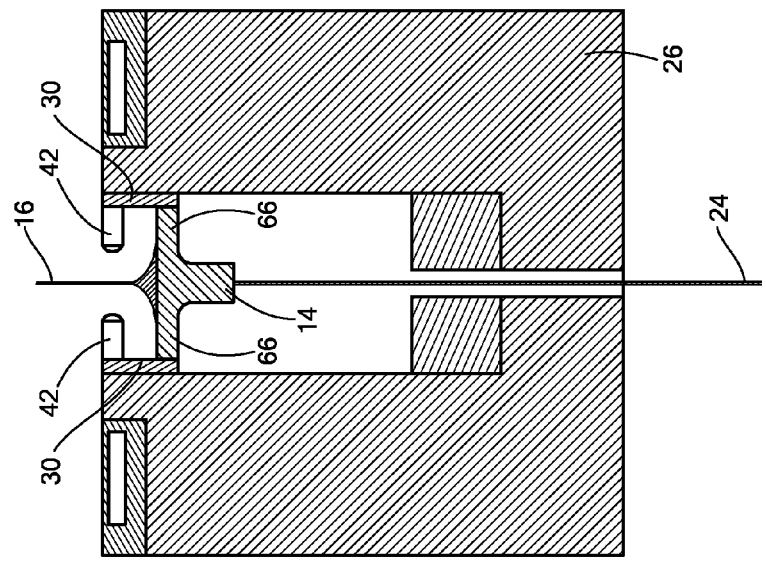
FIG. 14 schematically shows a cross-sectional view of one portion of a ribbon crystal growth system having a ribbon shield coupled to the base insulation according to embodiments of the present invention.

FIG. 14 schematically shows a cross-sectional view of a bottom portion of a ribbon crystal growth system 10 having a ribbon shield 30 coupled to the base insulation 26. As mentioned previously, the ribbon shield 30 may be coupled to at least a portion of the base insulation 26 positioned between the base insulation 26 and the crucible 14. The ribbon shield 30 may be coupled to the base insulation 26 on either side of the crucible 14 and may end somewhere below the top of the crucible where the molten material 22 is contained.

Figure 15:
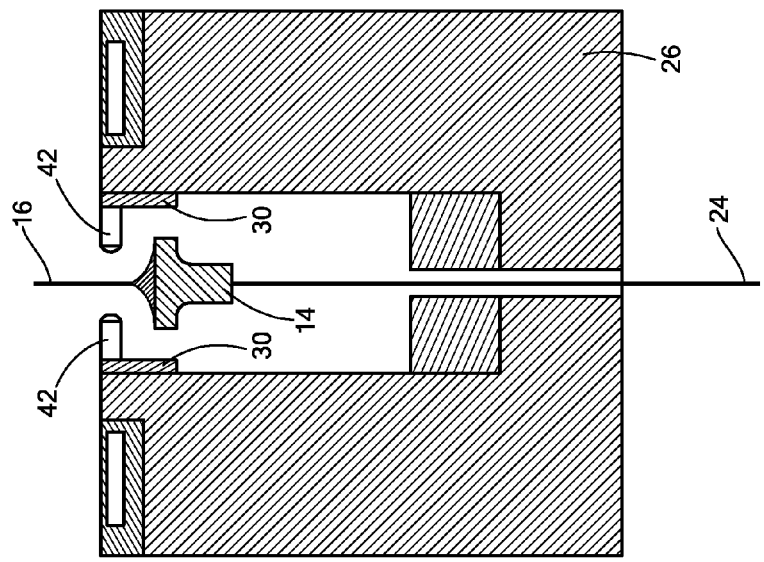
FIG. 15 schematically shows a cross-sectional view of one portion of a ribbon crystal growth system having a ribbon shield coupled to the base insulation and a crucible with baffles according to embodiments of the present invention.

The upper section of the crucible 14 may also include one or more baffles 66 that extend to the ribbon shield 30 on either side of the crucible 14, as shown FIG. 15. The baffles 66 may prevent contamination from the base insulation 26 from being incorporated into the growing ribbon crystal 16 near the molten material 22. The baffles 66 may also direct the flow of gas out between the afterheater 28 and the base insulation 26 in embodiments that include a gas system in the afterheater 28 and/or on the housing 12.

Various embodiments of the present invention may also be combined. For example, the gas system in the base insulation 26 may be used with a gas system in the afterheater 28 and/or a gas system on the housing 12. Similarly, the ribbon shield 30 coupled to the base insulation 26 and/or the afterheater 28 may be used with one or more gas systems in the base insulation 26, in the afterheater 28, and/or on the housing 12. Accordingly, the generally separate discussion of each of these aspects of the different embodiments is not intended to limit all embodiments.

Although the above discussion discloses various exemplary embodiments of the invention, it should be apparent that those skilled in the art can make various modifications that will achieve some of the advantages of the invention without departing from the true scope of the invention.

What is claimed is:

1. A method of growing a ribbon crystal, the method comprising:
   providing a crucible containing molten material;
   passing string through the molten material to grow the ribbon crystal; and
   directing gas flow around the ribbon crystal such that the gas flows down along the surface of the ribbon crystal toward the crucible.

2. The method of claim 1, further comprising: providing an afterheater positioned above the crucible and adjacent to the ribbon crystal on at least one side, the afterheater having a shield coupled to at least a portion of the afterheater, the shield positioned between the ribbon crystal and the afterheater.

3. The method of claim 2, wherein the shield includes graphite, silicon carbide, quartz, or a combination thereof.

4. The method of claim 2, wherein the shield includes a plurality of sheets coupled to the afterheater with at least one rib.

5. The method of claim 4, wherein the at least one rib is aligned near an edge of the ribbon crystal.

6. The method of claim 1, further comprising:
   providing a base insulation that surrounds the crucible on at least two sides,
   the base insulation having a shield coupled to at least a portion of the base insulation,
   wherein the shield is positioned between the base insulation and the crucible.

7. The method of claim 6, wherein the crucible includes at least one baffle that abuts a portion of the shield.

8. The method of claim 1, further comprising:
   providing a base insulation that surrounds the crucible on at least two sides,
   the base insulation having at least one opening beneath the crucible,
   wherein the gas flows down past the crucible and through the at least one opening.

9. The method of claim 8, further comprising:
   directing gas into the at least one opening from an external gas source.

10. The method of claim 8, wherein the base insulation has a shield coupled to at least a portion of the base insulation, wherein the shield is positioned between the base insulation and the crucible.

11. The method of claim 8, further comprising:
    providing at least one baffle coupled to the base insulation,
    wherein the gas flow is directed down past the at least one baffle and the crucible.

12. The method of claim 1, further comprising:
    providing an afterheater positioned above the crucible and adjacent to the ribbon crystal on at least two sides, the afterheater having at least one opening; and
    directing gas into the at least one opening from an external gas source, wherein the gas is directed toward the ribbon crystal.

13. The method of claim 12, wherein the afterheater has a shield coupled to at least a portion of the afterheater, the shield positioned between the ribbon crystal and the afterheater.

14. The method of claim 12, further comprising:
    providing a gas seal coupled to the afterheater and adjacent to the ribbon crystal,
    wherein the gas flow is substantially away from the gas seal and toward the crucible.

15. The method of claim 1, further comprising:
    providing a housing surrounding the crucible and a portion of the ribbon crystal; and
    providing a shield coupled to at least a portion of the housing, wherein the shield is adjacent to a portion of the ribbon crystal.

16. The method of claim 15, further comprising:
    providing a gas seal coupled to the housing and adjacent to the ribbon crystal,
    the gas seal having at least one opening; and directing gas into the at least one opening from an external gas source, wherein the gas is directed toward the ribbon crystal and gas flow is substantially away from the gas seal and along the shield between the ribbon crystal and the shield.

17. A ribbon crystal growth system comprising:
a crucible for containing molten material and growing a ribbon crystal;
a base insulation that surrounds the crucible on at least two sides, the base insulation having at least one opening beneath the crucible; and
a gas system that provides gas from an external gas source through the at least one opening so that gas flows down along the surface of the ribbon crystal past the crucible and through the at least one opening.

18. The ribbon crystal growth system of claim 17, wherein the base insulation has a shield coupled to at least a portion of the base insulation, wherein the shield is positioned between the base insulation and the crucible.

19. The ribbon crystal growth system of claim 17, further comprising:
at least one baffle coupled to the base insulation,
wherein the gas flows down past the at least one baffle and the crucible.

20. The ribbon crystal growth system of claim 19, further comprising:
an afterheater positioned above the base insulation and the crucible,
the afterheater having an inner surface that allows a ribbon crystal to pass between two portions of the afterheater, and
an outer surface opposite from the inner surface,
wherein the at least one baffle is adjacent to the outer surface of the afterheater.

21. The ribbon crystal growth system of claim 17, further comprising:
an afterheater positioned above the base insulation and the crucible,
the afterheater having an inner surface; and at least one shield adjacent to the inner surface,
wherein the afterheater and the at least one shield are configured to allow a ribbon crystal to pass adjacent to the at least one shield.

22. The ribbon crystal growth system of claim 21, wherein the at least one shield includes graphite, silicon carbide, quartz, or a combination thereof.

23. The ribbon crystal growth system of claim 21, wherein the at least one shield includes a plurality of sheets coupled to the afterheater with at least one rib.

24. The ribbon crystal growth system of claim 23, wherein the crucible has at least two string holes that define a vertically extending plane along a ribbon crystal growth direction, the at least one rib being aligned with an edge of the plane.

25. A ribbon crystal growth system comprising:
a crucible for containing molten material and growing a ribbon crystal;
an afterheater positioned above the crucible, the afterheater having an inner surface; and
at least one shield adjacent to the inner surface,
wherein the afterheater and the at least one shield are configured to allow a ribbon crystal to pass adjacent to the at least one shield, and the at least one shield comprises a material which reduces outgassing of contaminants from the afterheater.

26. The ribbon crystal growth system of claim 25, wherein the shield is coupled to the inner surface of the afterheater with at least one rib.

27. The ribbon crystal growth system of claim 26, wherein the crucible has at least two string holes that define a vertically extending plane along a ribbon crystal growth direction, the at least one rib being aligned with an edge of the plane.

28. The ribbon crystal growth system of claim 25, further comprising:
a housing surrounding the crucible and configured to allow a ribbon crystal to pass through a channel in the housing, wherein the shield is coupled to the housing.

29. The ribbon crystal growth system of claim 28, further comprising:
a gas seal coupled to the housing,
the gas seal having at least one opening and configured to allow the ribbon crystal to pass through the at least one opening.

30. The ribbon crystal growth system of claim 25, further comprising:
a base insulation that surrounds the crucible on at least two sides; and
at least one base insulation shield coupled to at least a portion of the base insulation,
wherein the base insulation shield is positioned between the base insulation and the crucible.

31. The ribbon crystal growth system of claim 30, wherein the crucible includes at least one baffle that abuts a portion of the base insulation shield.

32. The ribbon crystal growth system of claim 25, wherein the shield comprises graphite, silicon carbide, quartz, or a combination thereof.

* * * * *